United States Patent
Sonehara (10) Patent No.: US 8,325,535 B2
(45) Date of Patent: Dec. 4, 2012

(54) NONVOLATILE SEMICONDUCTOR STORAGE DEVICE

(75) Inventor: Takeshi Sonehara, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/230,010

(22) Filed: Sep. 12, 2011

(65) Prior Publication Data

US 2012/0063245 A1    Mar. 15, 2012

(30) Foreign Application Priority Data

Sep. 14, 2010 (JP) ................ P2010-205195

(51) Int. Cl.
*G11C 11/34* (2006.01)
(52) U.S. Cl. .................................. 365/185.19
(58) Field of Classification Search .......... 365/185, 365/196
See application file for complete search history.

(56) References Cited

U.S. PATENT DOCUMENTS 7,889,537 B2 * 2/2011 Edahiro et al. ............. 365/148
2011/0103128 A1 5/2011 Kanno et al.
2011/0235392 A1 * 9/2011 Kawaguchi et al. .......... 365/148

FOREIGN PATENT DOCUMENTS

| JP | 2006-344349 | 12/2006 |
|----|-------------|---------|
| JP | 2009-135409 | 6/2009 |

* cited by examiner

*Primary Examiner* — Hoai V Ho
*Assistant Examiner* — Pablo Huerta
(74) *Attorney, Agent, or Firm* — Oblon, Spivak, McClelland, Maier & Neustadt, L.L.P.

(57) ABSTRACT

A nonvolatile semiconductor storage device according to an embodiment includes a write/erase unit, during data write or erase, the write/erase unit supplying a first electric pulse to a selected memory cell, the first electric pulse having an electric energy to an extent that an physical state of a memory element of the selected memory cell does not transition and accumulating charges in a rectifying element of the selected memory cell, after supplying the first electric pulse, and a certain pulse interval thereafter, and supplying a second electric pulse to the selected memory cell, the second electric pulse having larger electric energy than the first electric pulse, the second electric pulse causing the physical state of the memory element of the selected memory cell to transition.

20 Claims, 9 Drawing Sheets

NONVOLATILE SEMICONDUCTOR STORAGE DEVICE

CROSS-REFERENCE TO RELATED APPLICATIONS

This application is based upon and claims the benefit of priority from the prior Japanese Patent Application No. 2010-205195, filed on Sep. 14, 2010, the entire contents of which are incorporated herein by reference.

FIELD

Embodiments described herein relate to a nonvolatile semiconductor storage device.

BACKGROUND

Recently, electrically-rewritable variable resistive elements such as a ReRAM, a PRAM, and a PCRAM, which are a nonvolatile semiconductor storage device attract attention as a successor memory to a flash memory.

For example, in the case where the ReRAM is used, a memory cell array can be configured only by stacking the variable resistive element constituting the memory cell and a rectifying element in an intersection of a word line and a bit line, so that a memory system having high integration can be constructed. By the use of the memory cell array having the above structure, the plural memory cell arrays can be stacked to form a three-dimensional structure, which allows the higher integration to be achieved.

However, in a voltage applying method of the related art, when a PIN diode or the like is used as the rectifying element of the memory cell, it is difficult to obtain an on-current necessary to write and erase data during application of a reverse bias.

DETAILED DESCRIPTION

A nonvolatile semiconductor storage device according to an embodiment includes: a memory cell array including a first line, a second line intersecting the first line, and a memory cell provided at the intersection of the first line and the second line; and a write/erase unit configured to write and erase data in and from the memory cell selected by the first line and the second line, the memory cell including a memory element and a rectifying element connected in series, a physical state of the memory element being changed by electric energy, during data write or erase, the write/erase unit supplying a first electric pulse to the selected memory cell, the first electric pulse having an electric energy to an extent that the physical state of the memory element of the selected memory cell does not transition, and accumulating charges in the rectifying element of the selected memory cell, and after supplying the first electric pulse, and a certain pulse interval thereafter, the write/erase unit supplying a second electric pulse to the selected memory cell, the second electric pulse having larger electric energy than the first electric pulse, the second electric pulse causing the physical state of the memory element of the selected memory cell to transition.

Hereinafter, nonvolatile semiconductor storage devices of embodiments will be described with reference to the drawings.

[First Embodiment]

<Entire System>

Figure 1:
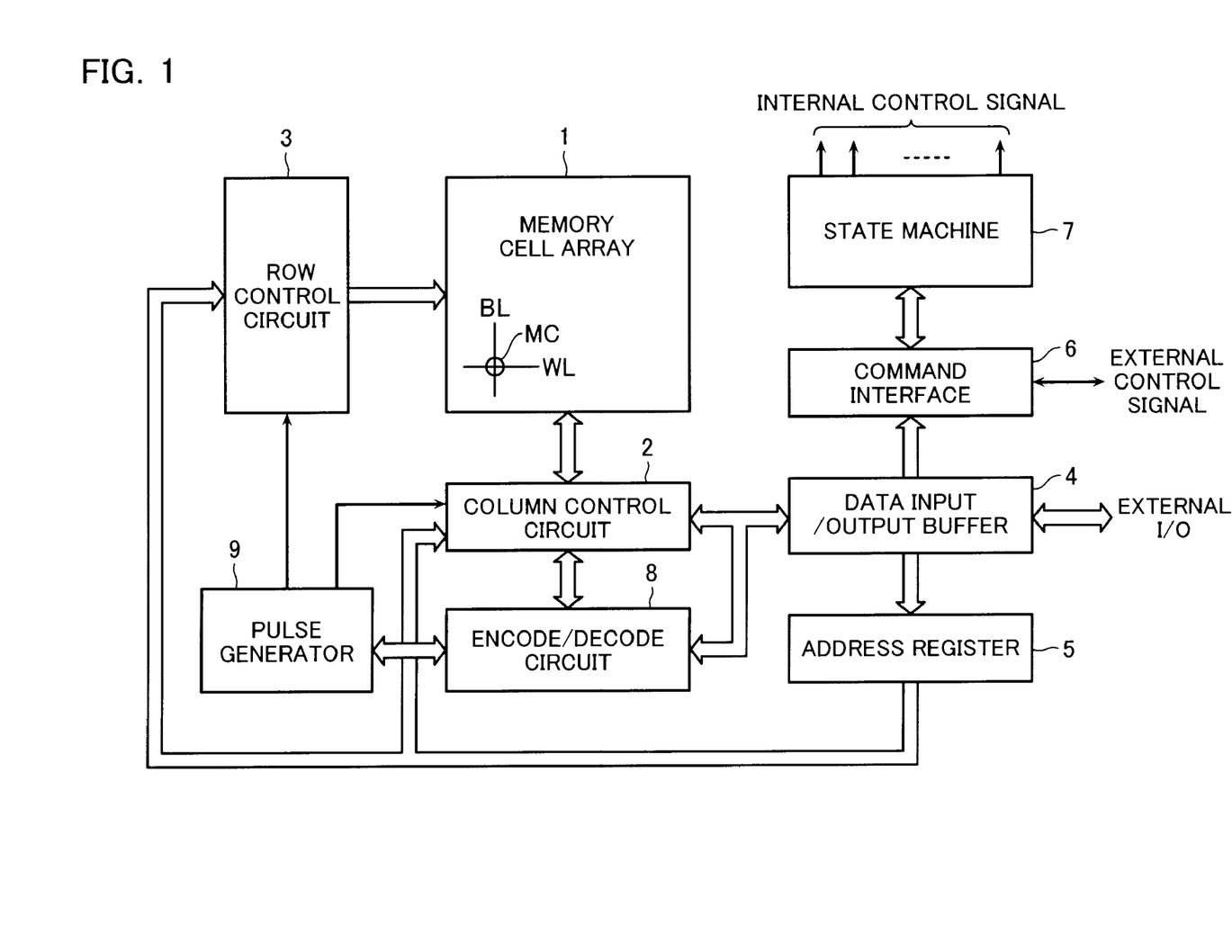
FIG. 1 is a block diagram of a nonvolatile semiconductor storage device according to a first embodiment.

FIG. 1 is a block diagram of a nonvolatile semiconductor storage device according to a first embodiment.

The nonvolatile semiconductor storage device of the first embodiment includes a memory cell array 1. The memory cell array 1 includes plural word lines WL (first lines), plural bit lines BL (second lines) that intersect the word lines WL, and plural memory cells MC that are provided in intersections of the word lines WL and the bit lines BL.

A column control circuit 2 is provided in a position adjacent to the memory cell array 1 in a direction of the bit line BL. The column control circuit 2 controls the bit line BL of the memory cell array 1 to erase data of the memory cell MC, to write data in the memory cell MC, and to read data from the memory cell MC.

A row control circuit 3 is provided in a position adjacent to the memory cell array 1 in a direction of the word line WL. The row control circuit 3 selects the word line WL of the memory cell array 1 to apply a voltage necessary to erase data of the memory cell MC, to write data in the memory cell MC, and to read data from the memory cell MC.

A data input/output buffer 4 is connected to an external host (not illustrated) through an input/output line to receive write data, an erase command, address data, and command data and to output read data. The data input/output buffer 4 transmits the received write data to the column control circuit 2 and receives the data read from the column control circuit 2 to output the data to the outside. An address supplied from the outside to the data input/output buffer 4 is transmitted to the column control circuit 2 and the row control circuit 3 through an address register 5. A command supplied from a host to the data input/output buffer 4 is transmitted to a command interface 6.

The command interface 6 receives an external control signal from the host to determine whether the data input to the data input/output buffer 4 is the write data, the command, or the address. When the data is the command, the command interface 6 receives the command to transition the command as a command signal to a state machine 7.

The state machine 7 manages the whole nonvolatile semiconductor storage device. The state machine 7 receives the command from the host and manages readout/write/erase of data, and input/output of data based on the command.

The data input from the host to the data input/output buffer 4 is transitioned to an encode/decode circuit 8, and an output signal of the encode/decode circuit 8 is input to a pulse generator 9. In response to the input signal, the pulse generator 9 outputs a write pulse having a predetermined voltage at predetermined timing. The pulse generated by and output from the pulse generator 9 is transitioned to a specific line selected by the column control circuit 2 and the row control circuit 3.

<Memory Cell>

The memory cell MC used in the nonvolatile semiconductor storage device of the first embodiment of FIG. 1 will be described below.

The memory cell MC of the first embodiment includes a memory element and a rectifying element, which are series-connected at the intersection of the word line WL and the bit line BL.

A variable resistive element or a phase-change element can be used as the memory element. The variable resistive element is made of a material in which a resistance value is changed by a voltage, a current, heat and the like. The phase-change element is made of a material in which a physical property such as a resistance value and a capacitance is changed by a phase change.

At this point, the phase change (phase transition) includes the following modes.

(1) Metal-semiconductor transition, metal-insulator transition, metal-metal transition, insulator-insulator transition, insulator-semiconductor transition, insulator-metal transition, semiconductor-semiconductor transition, semiconductor-metal transition, or semiconductor-insulator transition (2) Quantum-state phase change such as metal-superconductor transition (3) Paramagnetic material-ferromagnetic material transition, antiferromagnetic material-ferromagnetic material transition, ferromagnetic material-ferromagnetic material transition, ferrimagnetic material-ferromagnetic material transition, and transition of a combination thereof (4) Paraelectric material-ferroelectric material transition, paraelectric material-pyroelectric material transition, paraelectric material-piezoelectric material transition, ferroelectric material-ferroelectric material transition, antiferroelectric material-ferroelectric material transition, or transition of a combination thereof (5) Transition of a combination of the transitions (1) to (4), for example, transition to a ferroelectric ferromagnetic material from the metal, insulator, semiconductor, ferroelectric material, paraelectric material, pyroelectric material, piezoelectric material, ferromagnetic material, ferrimagnetic material, helimagnetic material, paramagnetic material, or antiferromagnetic material, or reverse transition thereof According to the definition, the phase-change element is included in the variable resistive element. However, in the first embodiment, the variable resistive element mainly means elements made of a metal oxide, a metal compound, an organic thin film, carbon, and carbon nanotube.

The first embodiment is directed to an ReRAM in which the variable resistive element is used as the memory element and a resistance-change memory such as a PCRAM in which the phase-change element is used as the memory element.

Figure 2:
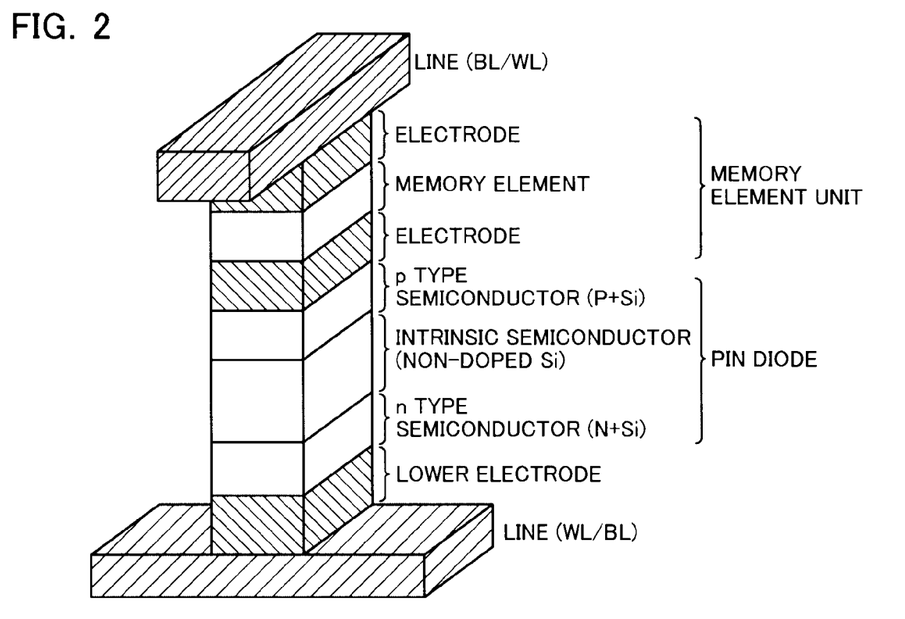
FIG. 2 is a perspective view illustrating a structure of a memory cell in the nonvolatile semiconductor storage device according to the first embodiment.

FIG. 2 is a perspective view of the memory cell MC in the case where a PIN diode is used as the rectifying element.

As illustrated in FIG. 2, the memory cell MC is provided at the intersection of the lower word line WL (or the bit line BL) and the upper bit line BL (or the word line WL). The memory cell MC is formed into a columnar shape comprising: a lower electrode; a PIN diode including an n type semiconductor (N+Si)/an intrinsic semiconductor (Non-doped Si)/a p type semiconductor (P+Si); and a memory element unit including an electrode/a memory element/an electrode, which are sequentially stacked from the lower layer to the upper layer. A thickness of the PIN diode ranges from 50 nm to 150 nm.

Figure 3:
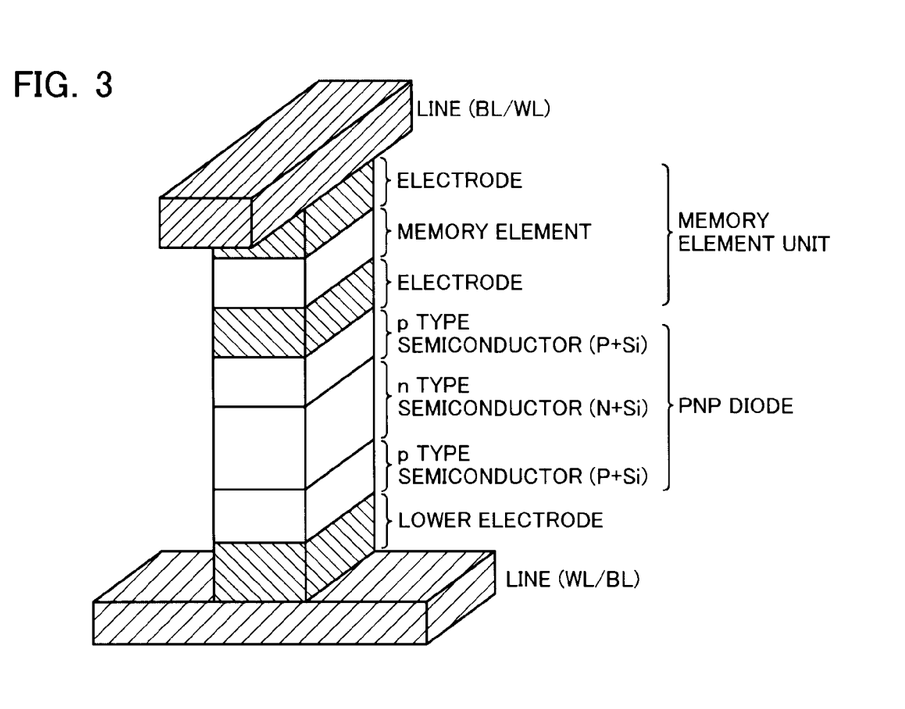
FIG. 3 is a perspective view illustrating a structure of the memory cell in the nonvolatile semiconductor storage device according to the first embodiment.

FIG. 3 is a perspective view of the memory cell MC in the case where a PNP element is used as the rectifying element.

As illustrated in FIG. 3, the memory cell MC is provided at the intersection of the lower word line WL (or the bit line BL) and the upper bit line BL (or the word line WL). In the memory cell MC, the lower electrode, a PNP element including a p type semiconductor (P+Si)/an n type semiconductor (N+Si)/a p type semiconductor (P+Si), and the memory element unit are sequentially stacked from the lower layer to the upper layer.

A thickness of the PNP element ranges from 50 nm to 150 nm. Instead of the PNP element, an NPN element including an n type semiconductor (N+Si)/a p type semiconductor (P+Si)/an n type semiconductor (N+Si) may be used as the rectifying element of the memory cell MC.

As can be seen from FIGS. 2 and 3, because the memory cells MC can be formed into a cross-point type, a large memory capacity can be constructed by three-dimensional integration. In addition, because of the property of the variable resistive element, a high-speed operation as fast as DRAM may be achieved.

Hereinafter, the memory element will mainly be described as the variable resistive element such as the ReRAM.

For the memory cell array 1 having a three-dimensional structure, a positional relationship between the variable resistive element and the rectifying element of the memory cell MC and a combination of orientations of the rectifying element can variously be selected in each layer.

Figure 4:
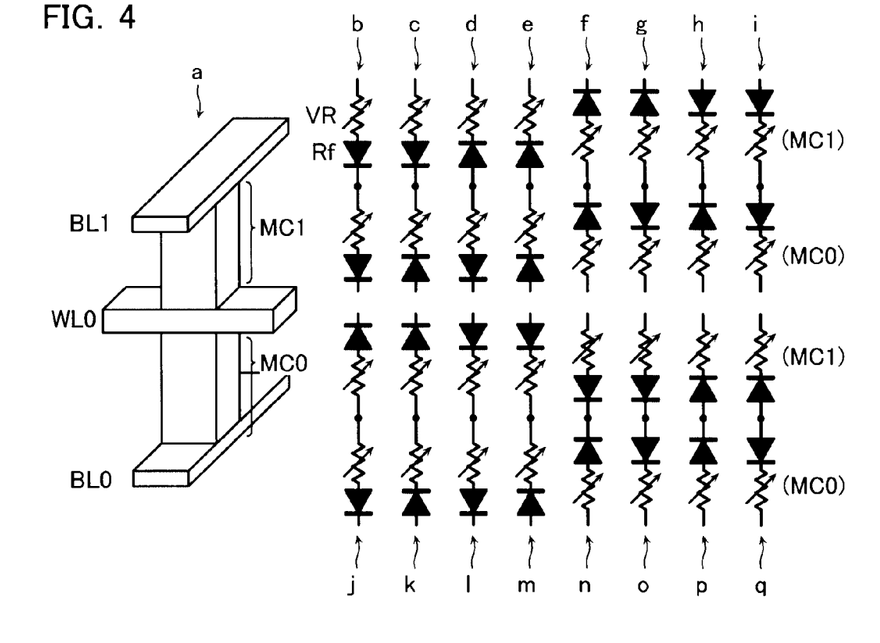
FIG. 4 is a view illustrating a disposition combination of a variable resistive element and a rectifying element of the memory cell in the semiconductor storage device according to the first embodiment.

As shown by "a" in FIG. 4, FIG. 4 illustrates patterns of combinations of a memory cell MC0 belonging to the lower memory cell array 1 and a memory cell MC1 belonging to the upper memory cell array 1 when a word line WL0 is shared by the memory cells MC0 and MC1. For the sake of convenience, the rectifying element is expressed by a symbol of a diode in FIG. 4. However, the rectifying element is not limited to a diode.

As illustrated in "b" to "q" of FIG. 4, 16 patterns are possible for the combinations of the memory cell MC0 and the memory cell MC1. For example, a positional relationship between the variable resistive element VR and the rectifying element Rf may be reversed. In addition, the orientation of the rectifying element Rf may be inverted. The patterns can be selected in consideration of the operating characteristic, an operating system, and a production process.

<Data Write/Erase Operation>

Then the operation to write and erase data in and from the memory cell MC will be described. Hereinafter, the write operation to cause the variable resistive element VR to transition from a high resistance state to a low resistance state is referred to as a "set operation", and the erase operation to cause the variable resistive element VR transition from the low resistance state to the high resistance state is referred to as a "reset operation". In the following description, current values and voltage values are shown by way of example. However, the current values and the voltage value depend on materials and dimensions of the variable resistive element VR and the rectifying element Rf.

Figure 5:
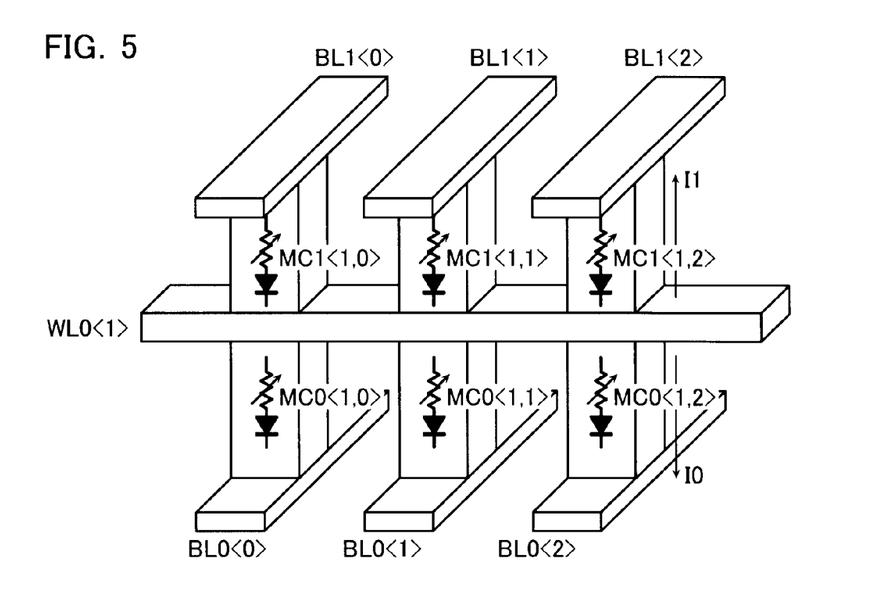
FIG. 5 is a view illustrating a state of a current passed through a selected memory cell and a current passed through a non-selected memory cell in the nonvolatile semiconductor storage device according to the first embodiment.

FIG. 5 is a schematic diagram illustrating part of the memory cell array 1. Referring to FIG. 5, the lower memory cell MC0 is provided at the intersection of the bit line BL0 and the word line WL0. The upper memory cell MC1 is provided at the intersection of the word line WL0 and the bit line BL1. The word line WL0 is shared by the memory cells MC0 and MC1.

The positional combination of the memory cells MC0 and MC1 in FIG. 5 is the same as the pattern "b" in FIG. 4. That is, in the memory cell MC0, the rectifying element Rf and the variable resistive element VR are sequentially stacked from the bit line BL0 to the word line WL0. The rectifying element Rf is disposed such that a direction from the word line WL0 to the bit line BL0 is set to a forward direction of the rectifying element Rf. On the other hand, in the memory cell MC1, the rectifying element Rf and the variable resistive element VR are sequentially stacked from the word line WL0 to the bit line BL1. The rectifying element Rf is disposed such that a direction from the bit line BL1 to the word line WL0 is set to a forward direction of the rectifying element Rf.

The set operation and the reset operation will be described in the case where a memory cell MC0<1,1> provided at the intersection of a bit line BL0<1> and a word line WL0<1> is selected as the selected memory cell.

There are two ways of performing the set operation and the reset operation to the memory cell MC: namely, a unipolar operation in which the set operation and the reset operation are performed by applying biases having the same polarity; and a bipolar operation in which the set operation and the reset operation are performed by applying biases having different polarities.

The unipolar operation will be described first.

In the set operation, it is necessary to apply a current having current density of $1 \times 10^6$ to $1 \times 10^8$ A/cm² or a voltage of 1 to 2 V to the variable resistive element VR. Accordingly, when the set operation is performed to the memory cell MC, it is necessary that the forward current be passed through the rectifying element Rf such that the predetermined current or voltage is applied to the variable resistive element VR.

In the reset operation, it is necessary to apply a current having current density of $1 \times 10^4$ to $1 \times 10^9$ A/cm² or a voltage of 1 to 3 V to the variable resistive element VR. Accordingly, when the reset operation is performed to the memory cell MC, it is necessary that the forward current be passed through the rectifying element Rf such that the predetermined current or voltage is applied to the variable resistive element VR.

In FIG. 5, the reset operation of the memory cell MC0<1, 1> can be performed by applying voltages of 3 V and 0 V to the word line WL0<1> and the bit line BL0<1>, which are connected to the memory cell MC0<1,1>, respectively.

As illustrated in FIG. 5, usually plural memory cells MC are connected to one word line WL or one bit line BL. At this point, not only is it necessary to apply the predetermined current or voltage to the selected memory cell MC, but also it is necessary to avoid the set operation and the reset operation from being performed in the non-selected memory cell MC.

In FIG. 5, when the voltage of 0 V is applied to the bit lines BL0<0> and BL0<2> similarly to the bit line BL0<1>, a forward current I0 is also passed through the non-selected memory cells MC0<1,0> and MC0<1,2> thus causing unexpected reset operation to be performed in the non-selected memory cells MC0<1,0> and MC0<1,2>. When the voltage of 0 V is applied to the bit lines BL1<0> to BL1<2>, the reverse bias is applied to the non-selected memory cells MC1<1,0> to MC1<1,2>. Therefore, it is necessary to suppress an off-current I1 such that the off-current I1 is not passed through the non-selected memory cells MC1<1,0> to MC1<1,2>.

Figure 6:
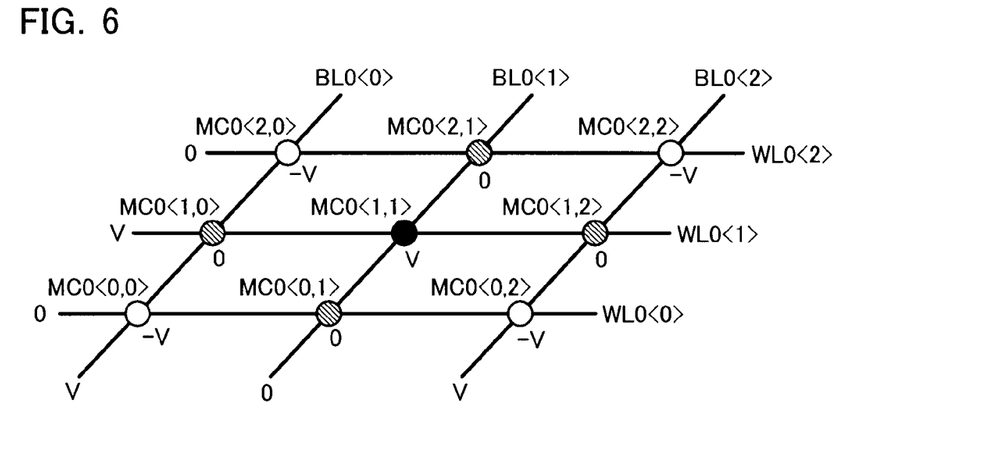
FIG. 6 is a view illustrating a bias state when the nonvolatile semiconductor storage device of the first embodiment is operated in a unipolar operation.

Therefore, in the case where the unipolar operation is performed, for example, it is possible to apply the bias to the memory cell array 1 as illustrated in FIG. 6.

That is, as illustrated in FIG. 6, the predetermined voltage V (for example, 3 V) is applied to the selected word line WL0<1>, and the voltage of 0 V is applied to other word lines WL0<0> and WL0<2>. The predetermined voltage of 0 V is applied to the selected bit line BL0<1>, and the voltage V is applied to other bit lines BL0<0> and BL0<2>.

As a result, the voltage V is applied to the selected memory cell MC0<1,1>. The voltage –V is applied to the non-selected memory cells MC0<0,0>, MC0<0,2>, MC0<2,0>, and MC0<2,2> that are connected to the non-selected word lines WL0<0> and WL0<2> and the non-selected bit lines BL0<0> and BL0<2>. The voltage of 0 V is applied to other memory cells MC0, namely, the non-selected memory cells (hereinafter referred to as a "half-selected memory cell") MC0<1,0>, MC0<1,2>, MC0<0,1>, and MC0<2,1> that are connected to only one of the selected word line WL0<1> and the selected bit line BL0<1>.

In this case, an element such as a diode is required, which has a current-voltage characteristics in which a current does not flow under a reverse bias less than a voltage −V, and a steep current increase is obtained under a forward bias. The use of such an element as the memory cell MC enables the set operation and the reset operation to be performed only in the selected memory cell MC0<1,1>.

Then the bipolar operation will be described.

For the bipolar operation, basically it is necessary to consider the following points, namely, (1) the current is bi-directionally passed through the memory cell MC unlike in the unipolar operation, (2) an operating speed, an operating current, and an operating voltage are changed from those of the unipolar operation, and (3) the bias is also applied to the half-selected memory cell MC.

Figure 7:
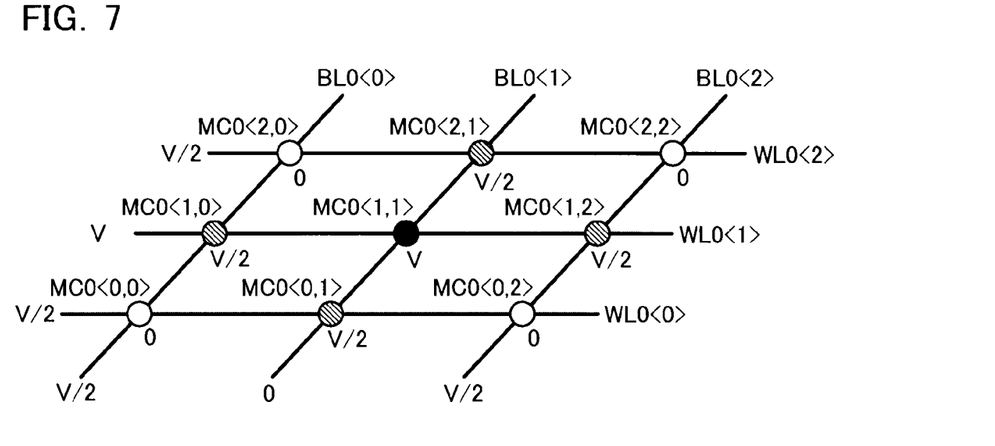
FIG. 7 is a view illustrating a bias state when the nonvolatile semiconductor storage device of the first embodiment is operated in a bipolar operation.

FIG. 7 is a view illustrating the point (3) and the state in which the bias is applied to the memory cell array 1 during the bipolar operation. In FIG. 7, the predetermined voltage V (for example, 3 V) is applied to the selected word line WL0<1>, and the voltage V/2 is applied to other word lines WL0<0> and WL0<2>. The voltage of 0 V is applied to the selected bit line BL0<1>, and the voltage V/2 is applied to other bit lines BL0<0> and BL0<2>.

In this case, as illustrated in FIG. 7, the voltage V/2 is applied to the half-selected memory cells MC0<1,0>, MC0<1,2>, MC0<0,1>, and MC0<2,1>. Accordingly, in the bipolar operation, it is necessary to prepare a rectifying element in which the current is not passed at the voltage of V/2 or less.

In consideration of the above-described facts, it is necessary to prepare a memory cell having the following conditions in order to construct the nonvolatile semiconductor storage device in which the memory cell including the variable resistive element and the rectifying element is used.

(1) Thinning and microfabrication of the memory cell are easy to perform, and the memory cell has a small variation in characteristic.

(2) The memory cell has low power consumption.

(3) During application of the bias, an on-current can sufficiently be passed through the memory cell while an off-current can sufficiently be suppressed.

(4) The memory cell has a high breakdown voltage during the application of the high bias.

As to the condition (1), microfabrication is hardly performed due to a relationship of an aspect ratio of the memory cell in the case where the memory cell is thick.

As to the condition (3), when the off-current is not suppressed, not only is an false write operation or a false erase operation generated in the non-selected memory cell or a read operation is hardly performed, but also the low power consumption of the condition (2) cannot be achieved. When the on-current is insufficiently passed, the memory cell is not operated as the memory. There is a trade-off relationship between improvement of the on-current and reduction of the off-current. The improvement of the on-current and the reduction of the off-current are the common problems for both the unipolar operation and the bipolar operation, and it is necessary to achieve a balance between the improvement of the on-current and the reduction of the off-current.

Additionally, in the Si PN diode, there are intrinsic problems of a principle, a structure, and thermal degradation during formation.

Therefore, the first embodiment provides a situation where impact ionization phenomenon tends to occur easily, the on-current is increased during the set operation and the reset operation.

An effect in the case where the impact ionization phenomenon is utilized will be described below.

Figure 8:
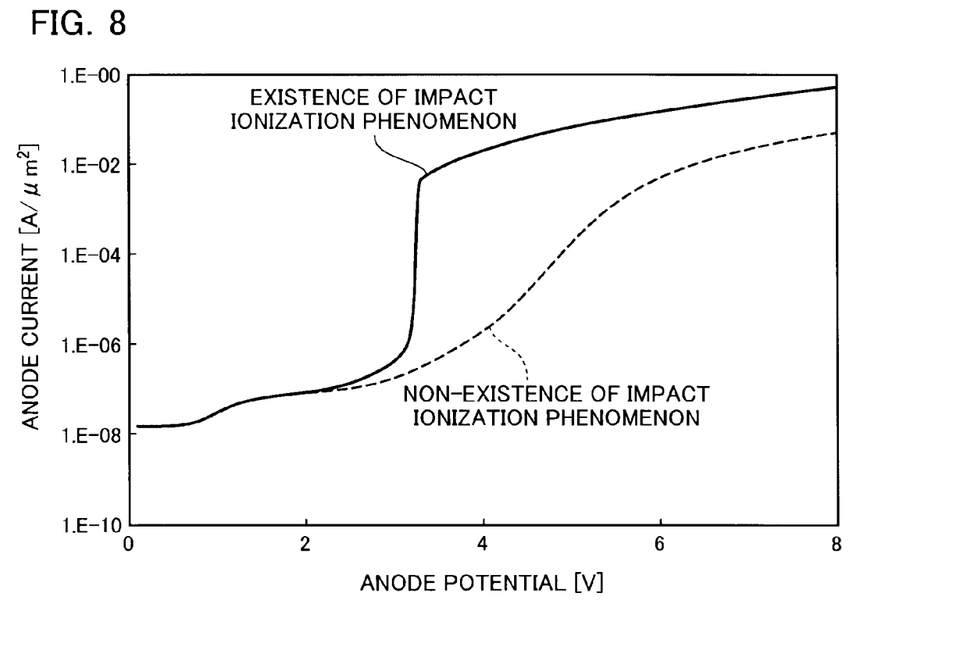
FIG. 8 is a reference view illustrating an effect of an impact ionization phenomenon.

FIG. 8 is a view illustrating an anode current of a punch-through element when an anode potential is charged from 0 V to 8 V.

When an anode potential is changed from 0 V to 8V in a punch-through element in which the impact ionization phenomenon, the anode current is elevated from about $1\times10^{-8}$ A/$\mu$m$^2$ to about $1\times10^{-2}$ A/$\mu$m$^2$ in a relatively moderate speed.

On the other hand, in a punch-through element in which the impact ionization phenomenon is utilized, although only the same anode current as in the case in which the impact ionization phenomenon is not utilized is passed when the anode potential ranges from 0 V to 3 V. When the anode potential reaches about 3 V, the anode current is rapidly elevated to about $1\times10^{-2}$ A/$\mu$m$^2$. When the anode potential reaches about 8 V, the anode current is passed up to about $1\times10^{0}$ A/$\mu$m$^2$.

For the punch-through element, the utilization of the impact ionization phenomenon can not only improve a ratio of the on-current and the off-current (hereinafter referred to as an "on/off ratio") but also increase the on-current.

Accordingly, the current-voltage characteristic of the rectifying element suitable to the set operation and the reset operation of the nonvolatile semiconductor storage device can be obtained when the impact ionization phenomenon is controlled.

A method for controlling the impact ionization phenomenon will be described below.

In this case, an IMPATT (IMPAct Ionization Transit Time) diode that is an rectifying element in which the impact ionization phenomenon is utilized will be described.

Figure 9:
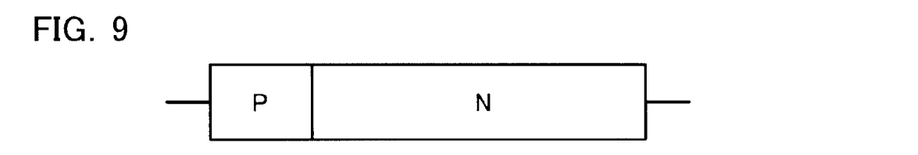
FIG. 9 is a reference view illustrating the effect of the impact ionization phenomenon.

As illustrated in FIG. 9, the IMPATT diode has a structure in which a p type semiconductor and an n type semiconductor longer than the p type semiconductor form a junction between then. A depletion region having a significantly low dopant concentration is formed in a central portion of the n type semiconductor.

Figure 10:
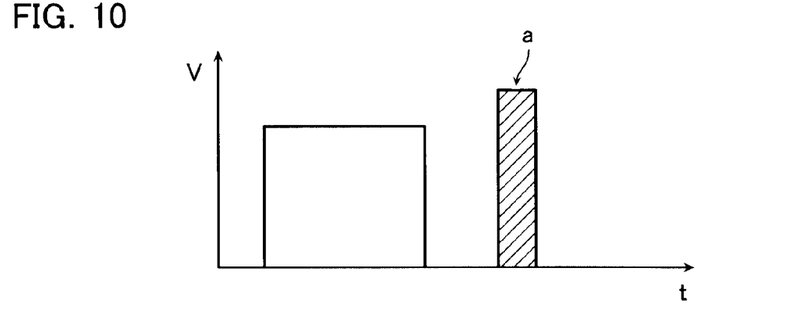
FIG. 10 is a reference view illustrating the effect of the impact ionization phenomenon.
Figure 11:
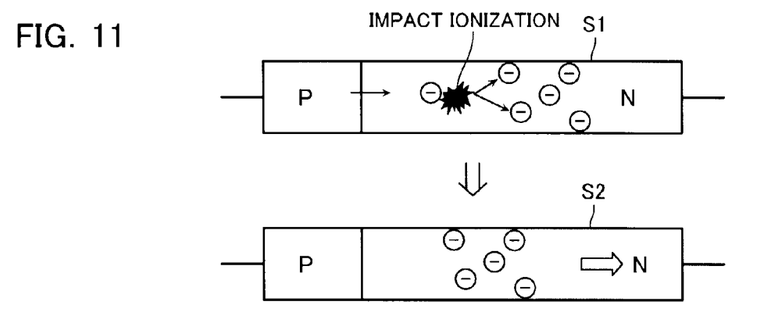
FIG. 11 is a reference view illustrating the effect of the impact ionization phenomenon.

FIG. 10 is a view illustrating an electric pulse applied to the IMPATT diode, and FIG. 11 illustrates a state of the IMPATT diode when the electric pulse of FIG. 10 is applied.

When the electric pulse is applied to the IMPATT diode, impact ionization is generated in the depletion region to generate charges as illustrated in a part S1 of FIG. 11. Therefore, the charges are increased with a time lag as illustrated in "a" of FIG. 10, thereby putting the rectifying element into a state in which the current is easy to pass. When the electric pulse is further applied to the IMPATT diode, a reverse current can also be passed by the charges in the depletion region as illustrated in a part S2 of FIG. 11.

In the above description, the DC electric pulse is used for the sake of easy understanding of the first embodiment. However, usually the IMPATT diode is used by applying an AC voltage.

As described above with reference to FIGS. 9 to 11, increase in on-current by the impact ionization phenomenon can be achieved by applying the plural electric pulses. In addition to the IMPATT diode, charge can also be generated in a TRAPATT diode when the impact ionization phenomenon is previously generated using the AC voltage. After the carriers exist temporarily, a current which is delayed by a timing determined by a transition time of the carriers can efficiently be obtained. In the situation described above, an electric field of the portion in which the charge is generated is weakened due to, for example, an avalanche breakdown. In this case, the total voltage applied to the entire element is constant, and therefore the region where the avalanche breakdown occurs is shifted to reach near the electrode. The avalanche breakdown continues until the carriers disappear.

In the first embodiment, a first electric pulse (hereinafter referred to as an "charging pulse") that accumulates the charges in the rectifying element (PIN diode, PNP element, or NPN element) is supplied to the memory cell before a second electric pulse (hereinafter referred to as an "operating main pulse") that causes a resistance state of the variable resistive element to transition.

Figure 12:
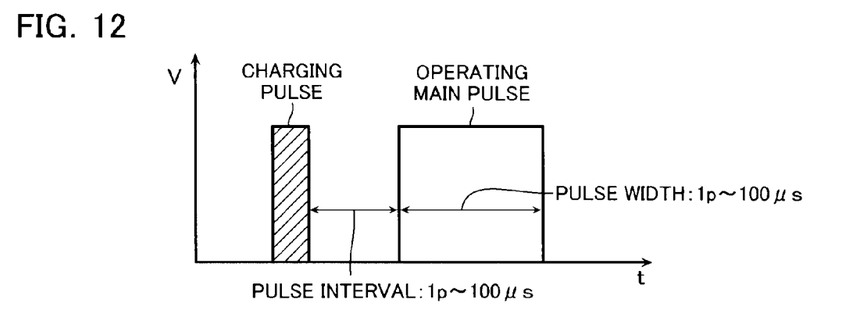
FIG. 12 is a view illustrating an example of an electric pulse supplied to the memory cell during data write/erase of the nonvolatile semiconductor storage device according to the first embodiment.
Figure 13:
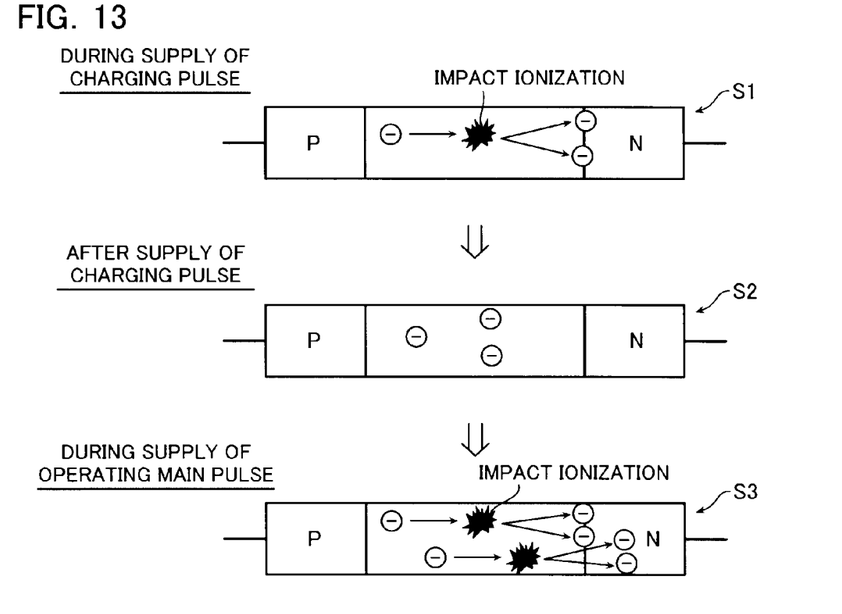
FIG. 13 is a view illustrating a state of a rectifying element when the electric pulse of FIG. 12 is supplied.

FIG. 12 illustrates an example in the case where the PIN diode is used in the memory cell and electric pulses supplied to the memory cell during the set operation and the reset operation. FIG. 13 is a view illustrating a state of the PIN diode when the electric pulses of FIG. 12 are supplied. Although the PIN diode is used as a rectifying element in the first embodiment, the same holds true for the PNP element or the NPN element.

During the set operation and the reset operation, first the charging pulse is supplied to the memory cell. Therefore, the impact ionization is generated to increase the charges in the intrinsic semiconductor or the region with a low dopant concentration of the PIN diode. Because the charging pulse is generated for accumulating the charges in the PIN diode, the charging pulse is supplied for a relatively short time such that electric energy is accumulated to an extent that the resistance state of the variable resistive element does not transition.

After the charging pulse is supplied, the intrinsic semiconductor or the region with a low dopant concentration of the PIN diode is in the state in which the charges are generated as illustrated in a part S2 of FIG. 13.

Then the pulse interval is set to 1 ps to 100 μs. The pulse interval is shorter than a time period for which the charges accumulated in the PIN diode by the charging pulse vanishes. Heat generated in the memory cell by the supply of the charging pulse is radiated by providing the pulse interval. Accordingly, the pulse interval is desirably set in consideration of a relationship between an amount of charge accumulated in the PIN diode and an amount of heat generated in the memory cell. According to calculation or a simulation, a pulse width of about 1 to about 10 μs and the pulse interval of about 1 to about 10 μs may suppress the increase in heat. It is not necessary that a temperature rise be suppressed to exactly zero. Accordingly, a balance between the generation of the charge and the heat radiation can be adjusted by providing a pulse interval of 10 μs or less in consideration of the above-described.

Then the operating main pulse having a width of, for example, 1 ps to 100 μs is supplied to the memory cell. The charging main pulse is supplied in order to cause the resistance state of the variable resistive element to transition. At this point, as illustrated in a part S3 of FIG. 13, the large on-current is passed by the charge that is generated in the PIN diode by the charging pulse.

A comparative example will be described before the description of the effect of the first embodiment.

Figure 23:
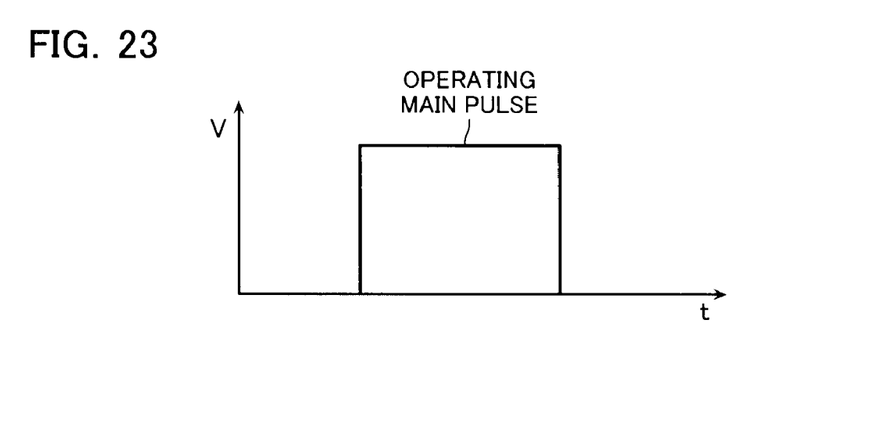
FIG. 23 is a view illustrating an electric pulse supplied to a memory cell of a nonvolatile semiconductor storage device according to a comparative example during data write/erase.

FIG. 23 is a view illustrating the electric pulse supplied to the memory cell of a nonvolatile semiconductor storage device according to a comparative example.

In the comparative example, only the operating main pulse is supplied to the memory cell during the set operation and the reset operation.

Originally an on-voltage at which passage of the on-current is started and a time since the supply of the electric pulse is started until passage of the on-current is started are different among the PIN diodes due to influences of the production process.

Therefore, when the operating main pulse is directly supplied to the memory cell like the comparative example, not only is the on-current insufficiently obtained but also the time the on-current is started to flow varies, and therefore a variation in electric characteristic is generated by a difference of the heat generation amount during the set operation and the reset operation.

The effects of the first embodiment will be described below in consideration of the problem of the comparative example.

(1) Even if the same operating main pulse is supplied, the large on-current can be passed compared with the comparative example. Therefore, the voltage necessary for the set operation and the reset operation can be reduced, and reduction of a leakage current from the half-selected memory cell and improvement in the operating speed can be achieved.

(2) Because the on-current is generated only by the operating main pulse in the comparative example, the operating characteristic of the memory cell is determined by a physical phenomenon at the time the memory cell material such as the Si and metal is deposited. On the other hand, in the first embodiment, the charging pulse is supplied before the operating main pulse, which allows the operating characteristic of the memory cell to be improved or adjusted in an ex-post manner.

(3) As described above, the structure of the memory cell of the first embodiment is similar to that of the comparative example. That is, the large on-current can be obtained while the suppression effect of the off-current is maintained, and the power consumption can also be suppressed.

(4) When the time of the electric pulse supplied to the memory cell is lengthened, not only the power consumption but also the heat generation amount is increased. In such cases, a risk of thermal breakage of the memory cell is increased. According to the first embodiment, the electric pulse is supplied while divided into plural electric pulses, so that the on-current can efficiently be generated while the heat is radiated between the charging pulse and the operating main pulse. Therefore, the thermal breakage of the memory cell can be suppressed.

[Second Embodiment]

The same effect as the first embodiment can be obtained by other methods than the electric pulse supplying method of FIGS. 12 and 13.

Other examples of the electric pulse supplying method will briefly be described in a second embodiment.

Figure 14:
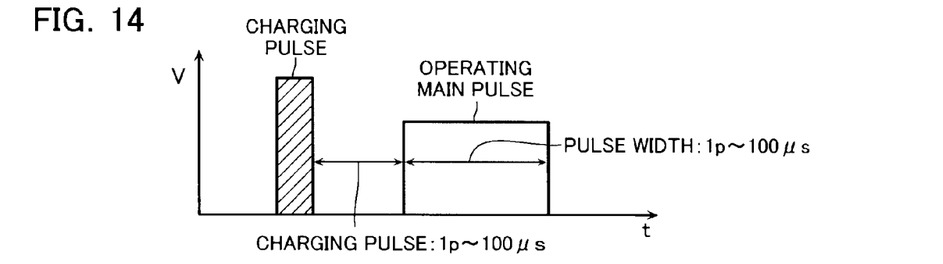
FIG. 14 is a view illustrating an example of the electric pulse supplied to a memory cell during data write/erase of a nonvolatile semiconductor storage device according to a second embodiment.

FIG. 14 illustrates an example in which the charging pulse differs from the operating main pulse in height, and the charging pulse is higher than the operating main pulse. The height and the width of the charging pulse are set, because the electric pulse to the extent that the resistance state of the variable resistive element does not transition may be used as the charging pulse.

Figure 15:
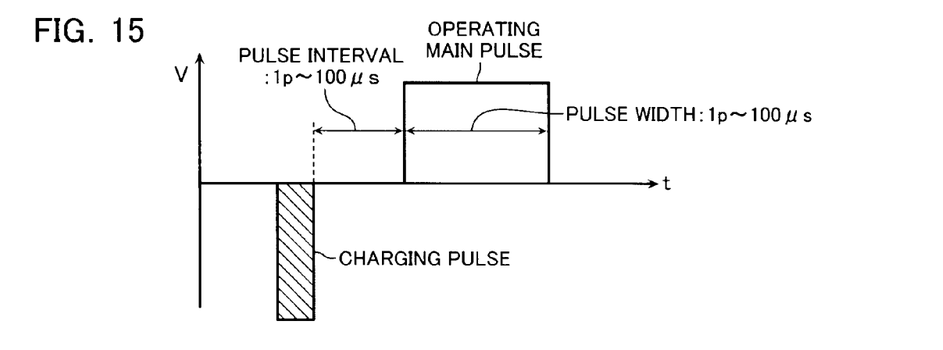
FIG. 15 is a view illustrating another example of the electric pulse supplied to the memory cell during the data write/erase of the nonvolatile semiconductor storage device according to the second embodiment.
Figure 16:
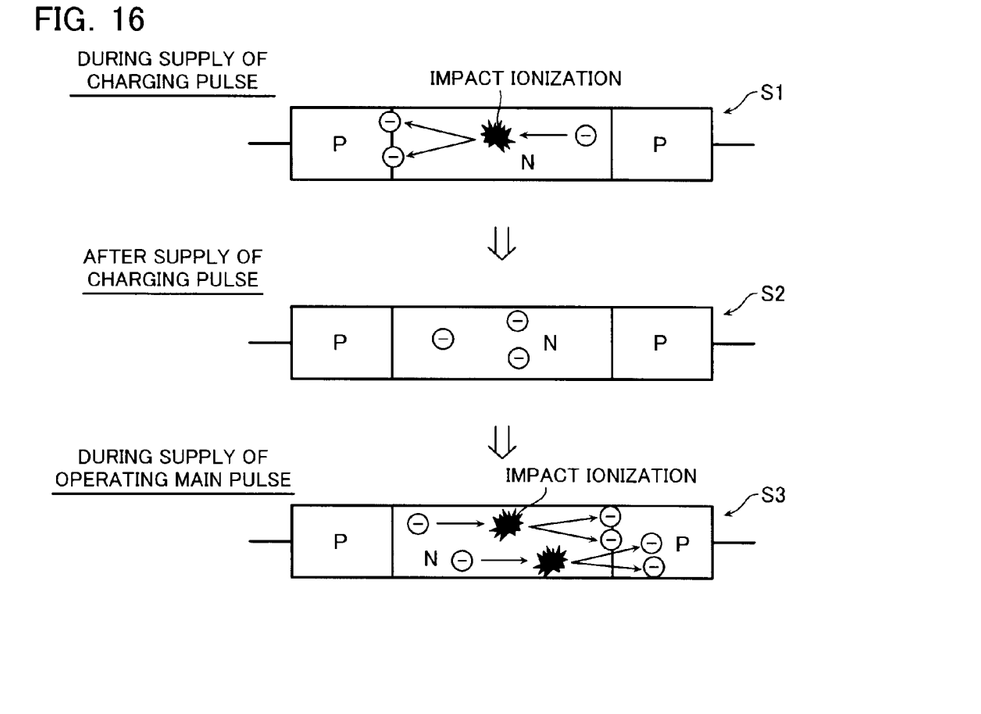
FIG. 16 is a view illustrating a state of the rectifying element when the electric pulse of FIG. 15 is supplied.

FIG. 15 illustrates an example in which the charging pulse differs from the operating main pulse in polarity. FIG. 16 is a view illustrating a state of the PNP element in the case where the electric pulse of FIG. 15 is supplied to the PNP element.

When the charging pulse is supplied, the impact ionization is generated by the charge supplied from the right of FIG. 16 to increase the charges in the n type semiconductor (S1). The n type semiconductor is in the state in which the charge is generated (S2). The operating main pulse having a polarity opposite to that of the charging pulse is supplied after a pulse interval of, for example, 1 ps to 100 μs. Therefore, many more pieces of impact ionization are generated by the charge supplied from the right of FIG. 16, and the large on-current is passed (S3).

For the rectifying element which does not have the polarity such as the PNP element and the NPN element, the charge may be accumulated in the rectifying element. Therefore, it is not necessary that the polarity of the charging pulse be matched with the polarity of the operating main pulse.

For the rectifying element which has a polarity such as the PIN element, a positive charging pulse is applied to the PIN diode to accumulate many carriers, after which a negative operating main pulse is applied to the PIN diode. As a result, a reverse current is easy to flow. In this manner, the charge can also be accumulated by a forward current.

Figure 17:
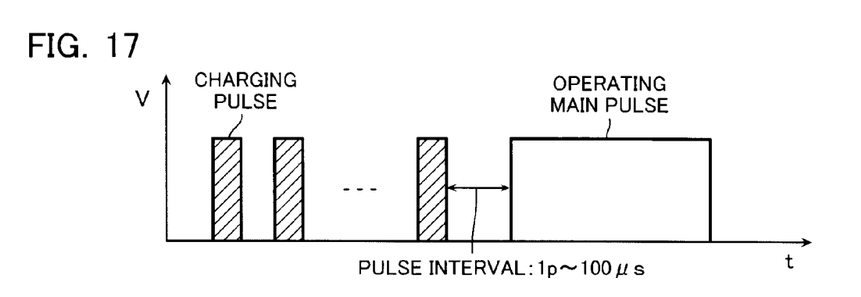
FIG. 17 is a view illustrating another example of the electric pulse supplied to the memory cell during the data write/erase of the nonvolatile semiconductor storage device according to the second embodiment.
Figure 18:
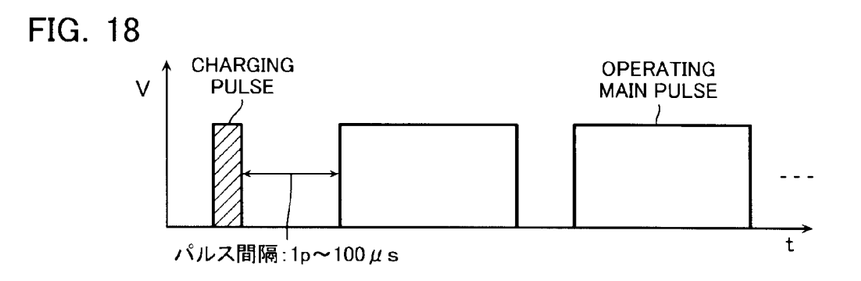
FIG. 18 is a view illustrating another example of the electric pulse supplied to the memory cell during the data write/erase of the nonvolatile semiconductor storage device according to the second embodiment.
Figure 19:
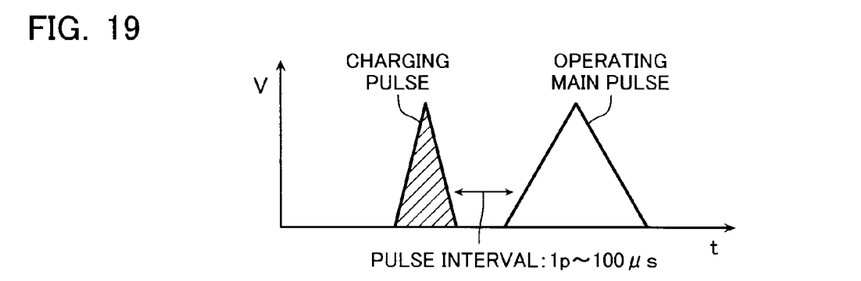
FIG. 19 is a view illustrating another example of the electric pulse supplied to the memory cell during the data write/erase of the nonvolatile semiconductor storage device according to the second embodiment.
Figure 20:
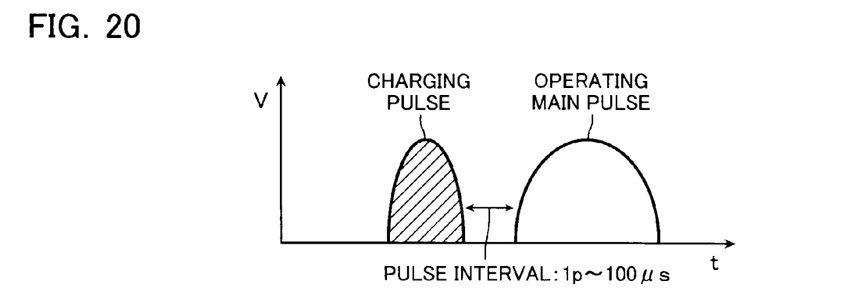
FIG. 20 is a view illustrating another example of the electric pulse supplied to the memory cell during the data write/erase of the nonvolatile semiconductor storage device according to the second embodiment.
Figure 21:
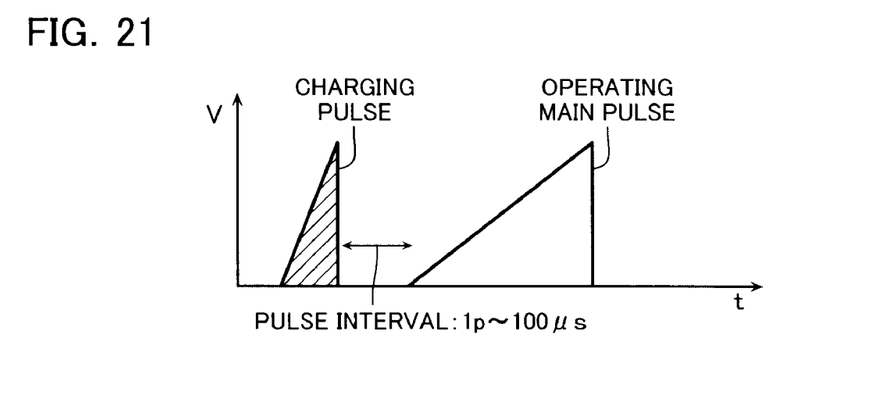
FIG. 21 is a view illustrating another example of the electric pulse supplied to the memory cell during the data write/erase of the nonvolatile semiconductor storage device according to the second embodiment.
Figure 22:
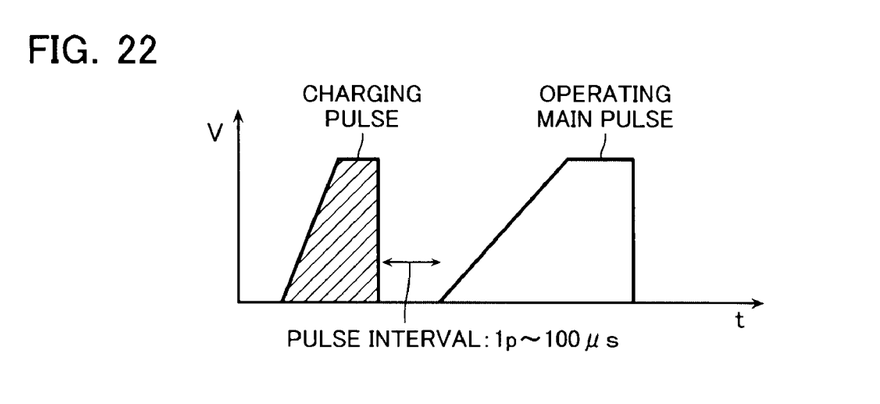
FIG. 22 is a view illustrating another example of the electric pulse supplied to the memory cell during the data write/erase of the nonvolatile semiconductor storage device according to the second embodiment.

FIG. 17 illustrates the case where the charging pulse is supplied a plurality of times before the operating main pulse, and FIG. 18 illustrates the case where the operating main pulse is supplied a plurality of times after the one charging pulse. In the second embodiment, the charge can be accumulated in the rectifying element before the operating main pulse to put the rectifying element into the state in which the on-current is easy to pass. Therefore, there is no limitation to the numbers of times of the charging pulses and the operating main pulses. The numbers of times of the charging pulses and the operating main pulses can properly be set in consideration of the processing speeds of the set operation and the reset operation and the influence of the heat generation.

FIGS. 19 to 22 illustrate examples in the case where the charging pulse and the operating main pulse have shapes different from the rectangle. The charging pulse and the operating main pulse are formed into triangular shapes in FIG. 19, into semielliptical shapes in FIG. 20, into saw-tooth shapes in FIG. 21, and into trapezoidal shapes in FIG. 22.

Actually, even if the rectangular electric pulse of FIG. 12 is supplied, sometimes a waveform loses an edge thereof by the influence of a parasitic capacitance generated in the word line WL or the bit line BL. The shapes of the charging pulse and the operating main pulse can arbitrarily be set in any case including the unintended case. The charging pulse may differ from the operating main pulse in the shape.

The same effect as the first embodiment can be obtained in any one of the cases of FIGS. 14 to 22.

[Material for Memory Cell Array]

Finally materials used in the memory cell array of the first and second embodiments are summarized as follows. x and y express an arbitrary composition ratio.

<Rectifying Element>

The p type semiconductor and the n type semiconductor, which constitute the rectifying element, can be selected from a group of semiconductors such as Si, SiGe, SiC, Ge, and C.

A silicide containing Si, Ti, V, Cr, Mn, Fe, Co, Ni, Cu, Zn, Rh, Pd, Ag, Cd, In, Sn, La, Hf, Ta, W, Re, Os, Ir, Pt, and Au is used in a junction portion with an upper semiconductor constituting the rectifying element, and one or at least two of Sc, Ti, V, Cr, Mn, Fe, Co, Ni, Cu, Y, Zr, Nb, Mo, Tc, Ru, Rh, Pd, Ag, Cd, In, Sn, La, Hf, Ta, W, Re, Os, Ir, Pt, and Au are added to the silicide.

The plural insulating layers constituting the rectifying element are selected from the following materials.

(1) Oxides $SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, and AlSiO $AM_2O_4$ where A and M are the same or different elements and selected from one of Al, Sc, Ti, V, Cr, Mn, Fe, Co, Ni, Cu, Zn, Ga, and Ge.

Examples of $AM_2O_4$ include $Fe_3O_4$, $FeAl_2O_4$, $Mn_{1+x}Al_{2-x}O_{4+y}$, $Co_{1+x}Al_{2-x}O_{4+y}$, and $MnO_x$.

$AMO_3$ where A and M are the same or different elements and selected from one of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, and Sn.

Examples of $AMO_3$ include $LaAlO_3$, $SrHfO_3$, $SrZrO_3$, and $SrTiO_3$.

(2) Oxynitrides

SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, and AlSiON Materials in which oxygen elements of the oxides indicated by (1) are partially substituted by a nitrogen element In particular, preferably the insulating layer constituting the rectifying element is selected from a group of $SiO_2$, SiN, $Si_3N_4$, $Al_2O_3$, SiON, $HfO_2$, HfSiON, $Ta_2O_5$, $TiO_2$, and $SrTiO_3$.

As to the Si insulating film such as $SiO_2$, SiN, and SiON, the concentrations of the oxygen element and nitrogen element are not lower than $1 \times 10^{18}$ atoms/cm$^3$, respectively.

However, the plural insulating layers differ from each other in a barrier height.

A material including a dopant atom constituting a defect level or semiconductor/metal dot (quantum dot) may also be used as the insulating layer.

<Variable Resistive Element>

For example, the following materials are used as the variable resistive element of the memory cell MC or the memory layer in the case where the memory function is incorporated in the rectifying element.

(1) Oxides

One or a combination of $SiO_2$, $Al_2O_3$, $Y_2O_3$, $La_2O_3$, $Gd_2O_3$, $Ce_2O_3$, $CeO_2$, $Ta_2O_5$, $HfO_x$, HfON, HfSiON, $ZrO_x$, $TiO_2$, HfSiO, HfAlO, ZrSiO, ZrAlO, and AlSiO $AM_2O_4$ where A and M are the same or different elements and selected from one or a combination of Al, Sc, Ti, V, Cr, Mn, Fe, Co, Ni, Cu, Zn, Ga, and Ge.

Examples of $AM_2O_4$ include $Fe_3O_4$, $FeAl_2O_4$, $Mn_{1+x}Al_{2-x}O_{4+y}$, $Co_{1+x}Al_{2-x}O_{4+y}$, and $MnO_x$.

$AMO_3$ where A and M are the same or different elements and selected from one or a combination of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, and Sn.

Examples of $AMO_3$ include $LaAlO_3$, $SrHfO_3$, $SrZrO_3$, and $SrTiO_3$.

(2) Oxynitrides

One or a combination of SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, and AlSiON. A semiconductor layer such as Si, SiGe, P+Si or N+Si may be inserted between the memory element and the electrode material. For example, the memory element is made of a binary or ternary metal oxide or an organic material (including single layer film and nanotube). For example, carbon includes a two-dimensional structure such as the single layer film, nanotube, graphene, and fullerene. The metal oxides include the oxides indicated by (1) and the oxynitrides indicated by (2).

<Electrode Layer>

Single metallic element, plural mixtures, silicon, a silicide, an oxide, and a nitride can be cited as the electrode layer used in the memory cell MC.

Specifically, for example, the electrode layer is made of Pt, Au, Ag, TiAlN, SrRuO, Ru, RuN, Ir, Ti, V, Cr, Mn, Fe, Co, Ni, Cu, TiN, TaN, LaNiO, Al, PtIrO$_x$, PtRhO$_x$, Rh, TaAlN, Si, $SiTiO_x$, $WSi_x$, $TaSi_x$, $PdSi_x$, $PtSi_x$, $IrSi_x$, $ErSi_x$, $YSi_x$, $HfSi_x$, $NiSi_x$, $CoSi_x$, $TiSi_x$, $VSi_x$, $CrSi_x$, $MnSi_x$, and $FeSi_x$.

The electrode layer may simultaneously act as a barrier metallic layer or a bonding layer.

<Word Line and Bit Line>

For example, the conductive line that acts as the word line WL and the bit line BL of the memory cell array 1 is made of W, WN, Al, Ti, V, Cr, Mn, Fe, Co, Ni, Cu, TiN, $WSi_x$, $TaSi_x$, $PdSi_x$, $ErSi_x$, $YSi_x$, $PtSi_x$, $HfSi_x$, $NiSi_x$, $CoSi_x$, $TiSi_x$, $VSi_x$, $CrSi_x$, $MnSi_x$, and $FeSi_x$.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

In the embodiments, the first line has been described as the word line while the second line has been described as the bit line. Alternatively, the first line may be used as the bit line while the second line may be used as the word line.

What is claimed is:

1. A nonvolatile semiconductor storage device comprising:
   a memory cell array including a first line, a second line intersecting the first line, and a memory cell provided at the intersection of the first line and the second line; and
   a write/erase unit configured to write and erase data in and from the memory cell selected by the first line and the second line,
   the memory cell including a memory element and a rectifying element connected in series, a physical state of the memory element being changed by electric energy,
   during data write or erase, the write/erase unit supplying a first electric pulse to the selected memory cell, the first electric pulse having an electric energy to an extent that the physical state of the memory element of the selected memory cell does not transition, and accumulating charges in the rectifying element of the selected memory cell, and
   after supplying the first electric pulse, and a certain pulse interval thereafter, the write/erase unit supplying a second electric pulse to the selected memory cell, the second electric pulse having larger electric energy than the first electric pulse, the second electric pulse causing the physical state of the memory element of the selected memory cell to transition.

2. The nonvolatile semiconductor storage device according to claim 1, wherein a pulse width of the second electric pulse ranges from 1 ps to 100 μs.

3. The nonvolatile semiconductor storage device according to claim 1, wherein the first electric pulse differs from the second electric pulse in polarity.

4. The nonvolatile semiconductor storage device according to claim 1, wherein the rectifying element has a structure of p type semiconductor/intrinsic semiconductor/n type semiconductor, p type semiconductor/n type semiconductor/p type semiconductor, or n type semiconductor/p type semiconductor/n type semiconductor.

5. The nonvolatile semiconductor storage device according to claim 1, wherein the write/erase unit supplies the first electric pulse a plurality of times before supplying the second electric pulse.

6. The nonvolatile semiconductor storage device according to claim 1, wherein the write/erase unit supplies the second electric pulse a plurality of times after supplying the first electric pulse.

7. The nonvolatile semiconductor storage device according to claim 1, wherein the first electric pulse and the second electric pulse have a triangular shape, a semielliptical shape, a saw-tooth shape, or a trapezoidal shape.

8. A nonvolatile semiconductor storage device comprising:
   a memory cell array including a first line, a second line intersecting the first line, and a memory cell provided at the intersection of the first line and the second line; and
   a write/erase unit configured to write and erase data in and from the memory cell selected by the first line and the second line,
   the memory cell including a memory element and a rectifying element connected in series, a physical state of the memory element being changed by electric energy,
   during data write or erase, the write/erase unit supplying a first electric pulse to the selected memory cell, the first electric pulse having an electric energy to an extent that the physical state of the memory element of the selected memory cell does not transition, and accumulating charges in the rectifying element of the selected memory cell,
   after supplying the first electric pulse, and a certain pulse interval thereafter, the write/erase unit supplying a second electric pulse to the selected memory cell, the second electric pulse having larger electric energy than the first electric pulse, the second electric pulse causing the physical state of the memory element of the selected memory cell to transition, and
   the pulse interval being shorter than a time period for which the charges accumulated in the rectifying element by the first electric pulse vanishes.

9. The nonvolatile semiconductor storage device according to claim 8, wherein the pulse interval ranges from 1 ps to 100 μs.

10. The nonvolatile semiconductor storage device according to claim 8, wherein a pulse width of the second electric pulse ranges from 1 ps to 100 μs.

11. The nonvolatile semiconductor storage device according to claim 8, wherein the first electric pulse differs from the second electric pulse in polarity.

12. The nonvolatile semiconductor storage device according to claim 8, wherein the rectifying element has a structure of p type semiconductor/intrinsic semiconductor/n type semiconductor, p type semiconductor/n type semiconductor/p type semiconductor, or n type semiconductor/p type semiconductor/n type semiconductor.

13. The nonvolatile semiconductor storage device according to claim 8, wherein the write/erase unit supplies the first electric pulse a plurality of times before supplying the second electric pulse.

14. The nonvolatile semiconductor storage device according to claim 8, wherein the write/erase unit supplies the second electric pulse a plurality of times after supplying the first electric pulse.

15. A nonvolatile semiconductor storage device comprising:
    a memory cell array including a first line, a second line intersecting the first line, and a memory cell provided at the intersection of the first line and the second line; and
    a write/erase unit configured to write and erase data in and from the memory cell selected by the first line and the second line, the memory cell including a memory element and a rectifying element connected in series, a physical state of the memory element being changed by electric energy;

during data write or erase, the write/erase unit supplying a first electric pulse to the selected memory cell, the first electric pulse having an electric energy to an extent that the physical state of the memory element of the selected memory cell does not transition, and accumulating charges in the rectifying element of the selected memory cell, after supplying the first electric pulse, and a certain pulse interval thereafter, the write/erase unit supplying a second electric pulse to the selected memory cell, the second electric pulse having larger electric energy than the first electric pulse, the second electric pulse causing the physical state of the memory element of the selected memory cell to transition, and the pulse interval ranging from 1 ps to 100 μs.

16. The nonvolatile semiconductor storage device according to claim 15, wherein a pulse width of the second electric pulse ranges from 1 ps to 100 μs.

17. The nonvolatile semiconductor storage device according to claim 15, wherein the first electric pulse differs from the second electric pulse in a polarity.

18. The nonvolatile semiconductor storage device according to claim 15, wherein the rectifying element has a structure of p type semiconductor/intrinsic semiconductor/n type semiconductor, p type semiconductor/n type semiconductor/p type semiconductor, or n type semiconductor/p type semiconductor/n type semiconductor.

19. The nonvolatile semiconductor storage device according to claim 15, wherein the write/erase unit supplies the first electric pulse a plurality of times before supplying the second electric pulse.

20. The nonvolatile semiconductor storage device according to claim 15, wherein the write/erase unit supplies the second electric pulse a plurality of times after supplying the first electric pulse.

* * * * *